(12) United States Patent
Greenberg

(10) Patent No.: US 7,170,323 B1
(45) Date of Patent: Jan. 30, 2007

(54) DELAY LOCKED LOOP HARMONIC DETECTOR AND ASSOCIATED METHOD

(75) Inventor: Robert Greenberg, Portland, OR (US)

(73) Assignee: Pixelworks, Inc., Tualatin, OR (US)

( * ) Notice: Subject to any disclaimer, the term of this patent is extended or adjusted under 35 U.S.C. 154(b) by 0 days.

(21) Appl. No.: 11/125,933

(22) Filed: May 9, 2005

(51) Int. Cl.
*H03L 7/06* (2006.01)

(52) U.S. Cl. ................................ 327/158; 327/150

(58) Field of Classification Search ............. None
See application file for complete search history.

(56) References Cited

U.S. PATENT DOCUMENTS

| | | | | |
|---|---|---|---|---|
| 5,614,855 A | * | 3/1997 | Lee et al. | 327/158 |
| 5,811,998 A | * | 9/1998 | Lundberg et al. | 327/156 |
| 6,047,346 A | * | 4/2000 | Lau et al. | 327/158 |
| 6,762,626 B1 | * | 7/2004 | Dreps et al. | 327/2 |
| 6,774,693 B1 | * | 8/2004 | Carr | 327/276 |
| 6,838,918 B1 | * | 1/2005 | Kaviani | 327/160 |
| 6,847,241 B1 | * | 1/2005 | Nguyen et al. | 327/158 |
| 2005/0162199 A1 | * | 7/2005 | Green et al. | 327/156 |

* cited by examiner

*Primary Examiner*—Timothy P. Callahan
*Assistant Examiner*—Cassandra Cox
(74) *Attorney, Agent, or Firm*—Marger Johnson & McCollom P.C.

(57) ABSTRACT

We describe and claim a delay locked loop harmonic detector and associated method. A delay locked loop includes a detection circuit to generate a detection signal responsive to an input clock and a control circuit to synchronize the delay locked loop to a fundamental of the input clock responsive to the detection signal. A method includes detecting harmonic synchronization in a delay locked loop responsive to an input clock and locking the delay locked loop to a fundamental of the input clock responsive to the detecting.

20 Claims, 6 Drawing Sheets

DELAY LOCKED LOOP HARMONIC DETECTOR AND ASSOCIATED METHOD

FIELD

This application relates to a Delay Locked Loop (DLL) harmonic detector and associated method.

BACKGROUND

DLLs are advanced clock management circuits employed in systems supporting high bandwidth transfer rates. DLLs allow for precise synchronization of external and internal clocks. More particularly, DLLs generate internal clocks with a known phase relationship to an external input clock.

Low Voltage Differential Signaling (LVDS) receivers and transmitters often employ DLLs to generate multiple internal clocks having phases with a known relationship to the external input clock. A DLL typically consists of a chain of variable delay elements. When properly adjusted, the sum of all the delays in the delay elements equals the external clock's period. When this occurs, the DLL is said to be locked to the external clock. In some circumstances, however, the DLL locks to a multiple of the clock period (e.g., two or three times the clock period) resulting in erroneous operation.

Accordingly, a need remains for an improved DLL harmonic detector and associated method.

BRIEF DRAWINGS DESCRIPTION

We describe embodiments of this application referencing the following drawings.

DETAILED DESCRIPTION

Figure 1:
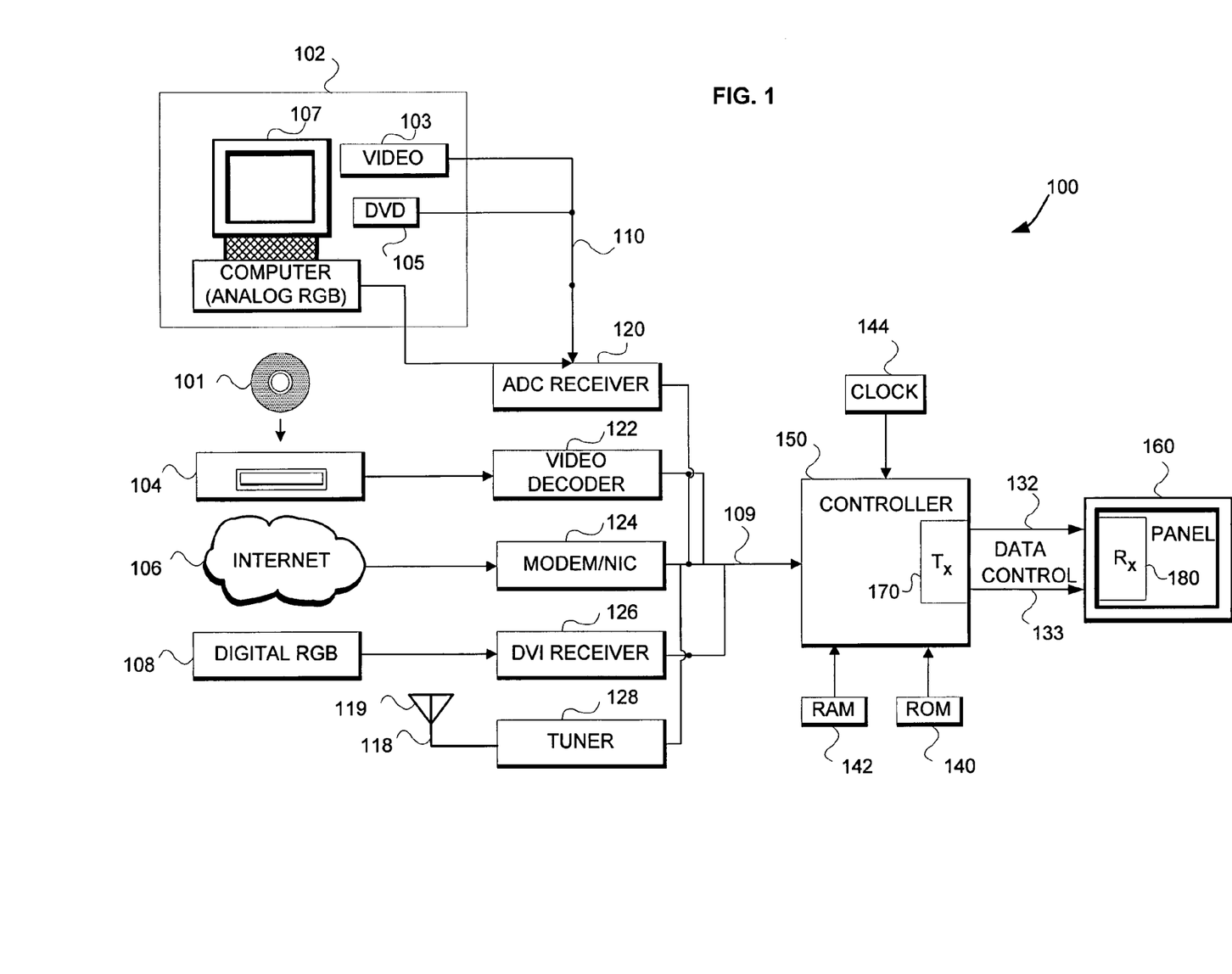
FIG. 1 is a block diagram of display system.

FIG. 1 is a block diagram of a display system 100. Referring to FIG. 1, the system 100 includes a receiver 120 for receiving an analog image data signal 110, e.g., RGB or $YP_BP_R$ signal, from a source 102. The source 102 may be a personal computer 107, a digital video disk player 105, set top box (STB) 103, or any other device capable of generating the analog image data signal 110. The receiver 120 may be an analog-to-digital converter (ADC) or any other device capable of generating digital video signal 109 from the analog image data 110. The receiver 120 converts the analog image data signal 110 into the digital image data 109 and provides it to a controller 150. A person of reasonable skill in the art knows well the design and operation of the source 102 and the receiver 120.

Likewise, a video receiver or decoder 122 decodes an analog video signal 112 from a video source 104. The video source 104 may be a video camcorder, tape player, digital video disk (DVD) player, or any other device capable of generating the analog video signal 112. The video source 104 may read (or play) external media 101. In an embodiment, a DVD player 104 plays the DVD 101. In another embodiment, a VHS tape player 104 plays a VHS tape 101. The decoder 122 converts the analog video signal 112 into the digital video signal 109 and provides it to the display controller 150. The decoder is any device capable of generating digital video signal 109, e.g., in Y/C or CVBS format, from the analog video signal 112. A person of reasonable skill in the art knows well the design and operation of the video source 104 and the video decoder 112.

A modem or network interface card (NIC) 124 receives data 114 from a global computer network 106 such as the Internet®. The data 114 may be in any format capable of transmission over the network 106. In an embodiment, the data 114 is packetized digital data. But the data 114 may also be in an analog form. Likewise, the modem 124 may be a digital or analog modem or any device capable of receiving and/or decoding data 114 from a network 106. The modem 124 provides digital video signal 109 to the display controller 150. A person of reasonable skill in the art knows well the design and operation of the network 106 and the modem/NIC 124.

A Digital Visual Interface (DVI) or high definition multimedia interface (HDMI) receiver 126 receives digital signals 116 from a digital source 108. In an embodiment, the source 108 provides digital RGB signals 116 to the receiver 126. The receiver 126 provides digital video signal 109 to the display controller 150. A person of reasonable skill in the art knows well the design and operation of the source 108 and the receiver 126.

A tuner 128 receives a wireless signal 118 transmitted by the antenna 119. The antenna 119 is any device capable of wirelessly transmitting or broadcasting the signal 118 to the tuner 128. In an embodiment, the antenna 119 transmits a television signal 118 to the television tuner 128. The tuner 128 may be any device capable of receiving a signal 118 transmitted wirelessly by any other device, e.g., the antenna 119, and of generating the digital video signal 109 from the wireless signal 118. The tuner 128 provides the digital video signal 109 to the controller 150. A person of reasonable skill in the art knows well the design and operation of the antenna 119 and the tuner 128.

The digital video signal 109 may be in a variety of formats, including composite or component video. Composite video describes a signal in which luminance, chrominance, and synchronization information are multiplexed in the frequency, time, and amplitude domain for single wire transmission. Component video, on the other hand, describes a system in which a color picture is represented by a number of video signals, each of which carries a component of the total video information. In a component video device, the component video signals may be processed separately and, ideally, encoding into a composite video signal occurs only once, prior to transmission. The digital video signal 109 may be a stream of digital numbers describing a continuous analog video waveform in either composite or component form. FIG. 1 describes a variety of devices (and manners) in which the digital video signal 109 may be generated from an analog video signal or other sources. A person of reasonable skill in the art should recognize other devices for generating the digital video signal 109 come within the scope of the application.

In FIG. 1, the controller 150 is shown as receiving the digital video signal 109. Alternatively, the controller 150 may receive an analog signal, e.g., analog image data signal 110 from the video 103, DVD 105, and/or computer 107. In the later case, the controller 150 may include means for receiving and converting the analog signal into the digital signal 109, e.g., ADC receiver 120 or video decoder 122.

The controller 150 may generate image data 132 and control signals 133 by manipulating the digital video signal 109 or any other signal it receives at its input. The display controller 150 provides the image data 132 and control signals 133 to a display 160 in any of a variety of manners. In an embodiment, the display 160 is a television either analog (e.g., Cathode Ray Tube (CRT)), digital (e.g., High Definition Television (HDTV)), or otherwise. The display 160 may be digital with a fixed pixel structure, e.g., active and passive LCD displays, plasma displays (PDP), field emissive displays (FED), electro-luminescent (EL) displays, micro-mirror technology displays, low temperature polysilicon (LTPS) displays, and the like. The display 160 may be other than a digital display, e.g., an analog display such as a CRT as used in monitors, projectors, personal digital assistants, and other like applications.

In an embodiment, the controller 150 may scale the digital video signal 109 for display using a variety of techniques including pixel replication, spatial and temporal interpolation, digital signal filtering and processing, and the like. In another embodiment, the controller 150 may additionally change the resolution of the digital video signal 109, changing the frame rate and/or pixel rate encoded in the digital video signal 109. We will not discuss scaling, resolution, frame, and/or pixel rate conversion, and/or color manipulation in any further detail. A person of reasonable skill in the art should recognize that the controller 150 may manipulate the video signal 109 and provides the image data 132 and control signals 133 to the display 160 such that it is capable of properly displaying a high quality image regardless of display type.

Read-only (ROM) and random access (RAM) memories 140 and 142, respectively, are coupled to the display system controller 150 and store bitmaps, FIR filter coefficients, and the like. A person of reasonable skill in the art should recognize that the ROM and RAM memories 140 and 142, respectively, may be of any type or size depending on the application, cost, and other system constraints. A person of reasonable skill in the art should recognize that the ROM and RAM memories 140 and 142, respectively, are optional in the system 100. A person of reasonable skill in the art should recognize that the ROM and RAM memories 140 and 142, respectively, may be external or internal to the controller 150. RAM memory 142 may be a flash type memory device. Clock 144 controls timing associated with various operations of the controller 150.

The controller 150 may include a transmitter 170 to transmit the data and control signals 132 and 133, respectively. And the panel 160 may include a receiver 180 to receive the data and control signals 132 and 133, respectively. In an embodiment, the transmitter 170 and receiver 180 are Low Voltage Differential Signal (LVDS) devices. Low voltage differential signaling uses high-speed analog circuit techniques to provide multi-gigabit data transfers on copper interconnects. LVDS signaling is a well-known interface standard for high speed data transmission described in part in the American National Standards Institute (ANSI)/Telecommunications Industry Association (TIA)/Electronic Industries Alliance (EIA)—644-1995 standard and other like documents.

Figure 2:
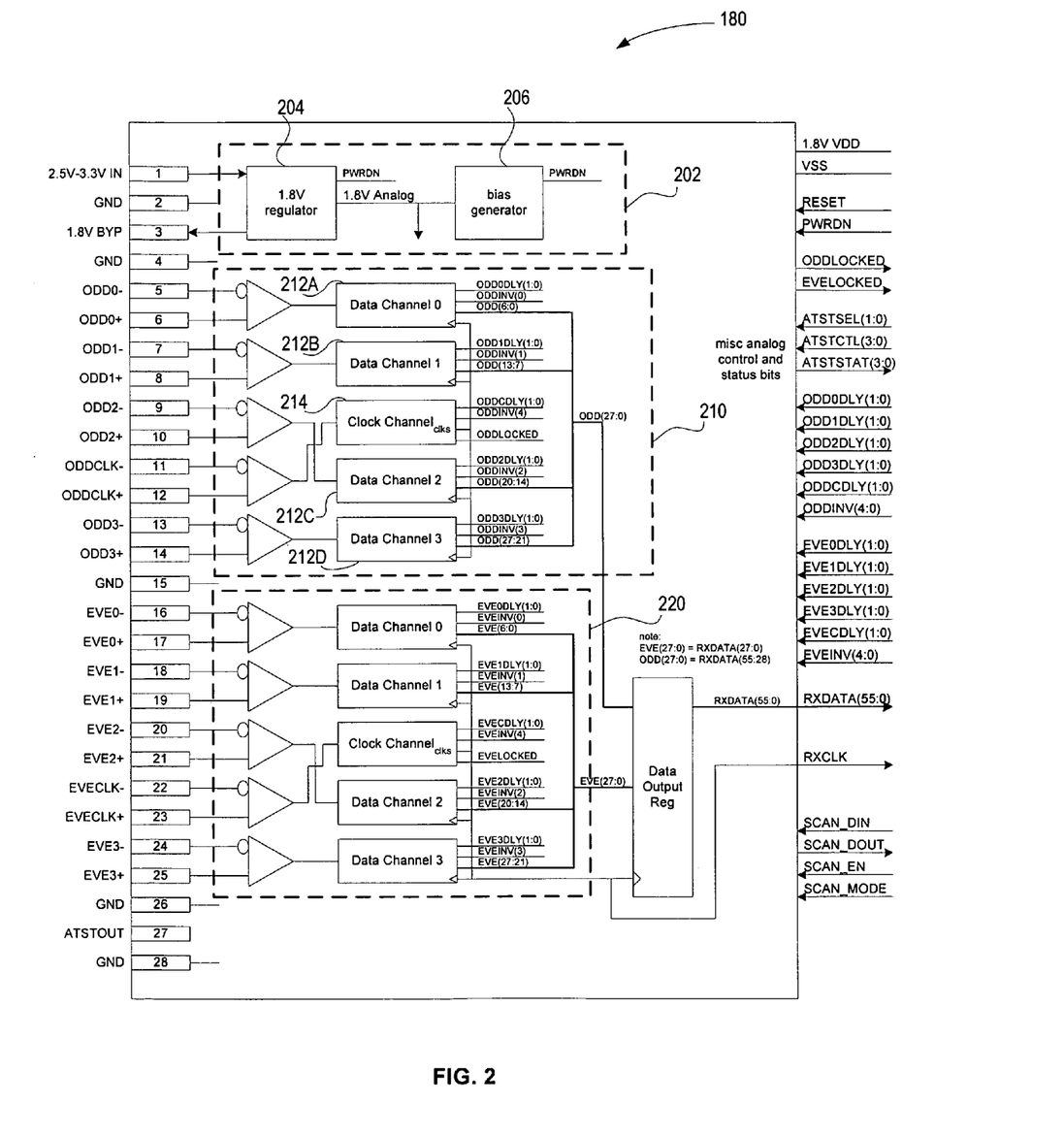
FIG. 2 is a block diagram of an embodiment of the LVDS receiver shown in FIG. 1.
Figure 3:
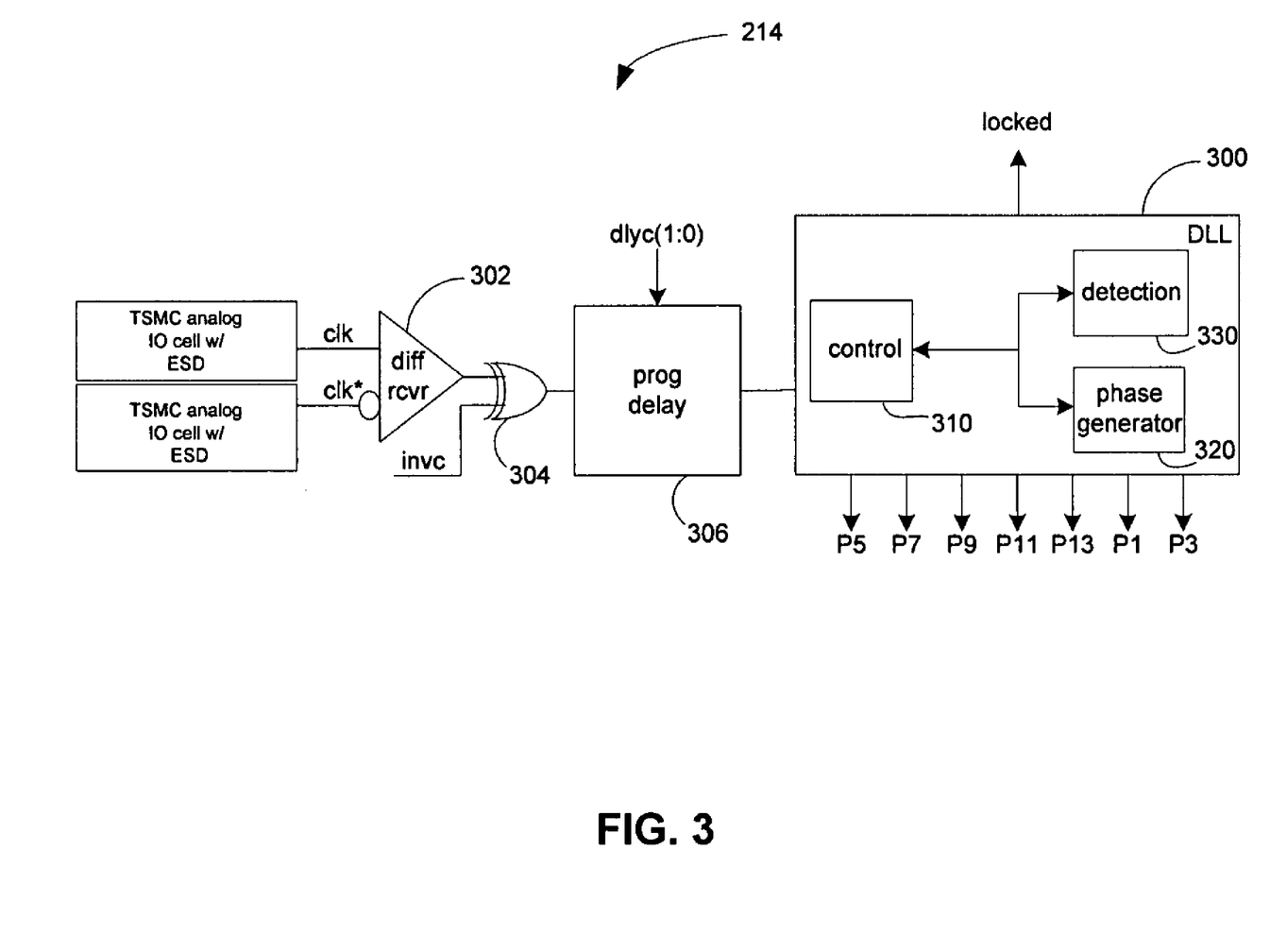
FIG. 3 is a block diagram of an embodiment of the clock channel shown in FIG. 2.

FIG. 2 is a block diagram of an embodiment of the LVDS receiver 180. FIG. 3 is a block diagram of an embodiment of the clock channel 214 shown in FIG. 2. Referring to FIGS. 2 and 3, in an embodiment, the LVDS receiver 180 is adapted to receive high speed, serialized, differential LVDS data 132 and control 133 at its inputs and present de-serialized data and control at its outputs. The LVDS receiver 180 may receive the data 132 from the LVDS transmitter 170. The LVDS receiver 180 may include a supply circuit 202. The supply circuit 202 may include a voltage regulator 204 to generate an internal voltage supply, e.g., 1.8V, from the external voltage supply, e.g., 2.5V–3.3V. The voltage regulator 202 may be linear and include bypass capacitors (not shown). And the supply circuit 202 may include a bias generator 206 to generate a bias voltage when necessary.

The LVDS receiver 180 may include a plurality of clock and data channels. In an embodiment, the LVDS receiver 180 includes two input channels 210 and 220, one each for odd and even data. Each input channel 210 may include four data channels 212A–D and a clock channel 214.

Referring to FIGS. 2 and 3, in an embodiment, the clock channel 214 may include a differential receiver 302, an inversion circuit 304, a programmable delay 306, and a DLL 300. The differential receiver 302 converts the input differential LVDS clock signal to a single-ended clock. The differential receiver 302 may operate off the external voltage supply, e.g., 2.5–3.3V. The differential receiver 302 may include standard analog input pads that protect against an electrostatic discharge event. The inversion circuit 304 inverts the clock output from the differential receiver 302 responsive to an invert clock control signal. The programmable delay 306 delays the clock signal responsive to delay clock control signals. We will not further discuss the design and operation of the differential receiver 302, inversion circuit 304, and programmable delay 306 as these circuits are well known.

In an embodiment, the DLL 300 includes phase generator 320, control circuit 310, and detection circuit 330. The phase generator 320 generates a multiphase clock from the input clock CLK. In an embodiment, the phase generator generates a fourteen phase clock P0–P13$_{[pvg1]}$ although only the odd clock phases may be used to capture data bits on both odd and even channels. This is because the even clock phases typically transition when the data is changing or transitioning. The odd clock phases, on the other hand, transition in the middle of each data bit window, when the data is stable. The data channel, e.g., 212A–D, uses the multiphase clock to capture and de-serialize the input data 132. The control circuit 310 generates the control signals necessary for the DLL 300 to generate the multiphase clock P0–P13 responsive to the input clock CLK. The control circuit 310 may, for example, generate synchronization signals for the DLL 300 to lock to a fundamental of the input clock. And the control circuit 310 may generate a clock present signal LOCK to detect the presence of the input clock CLK.

Figure 4:
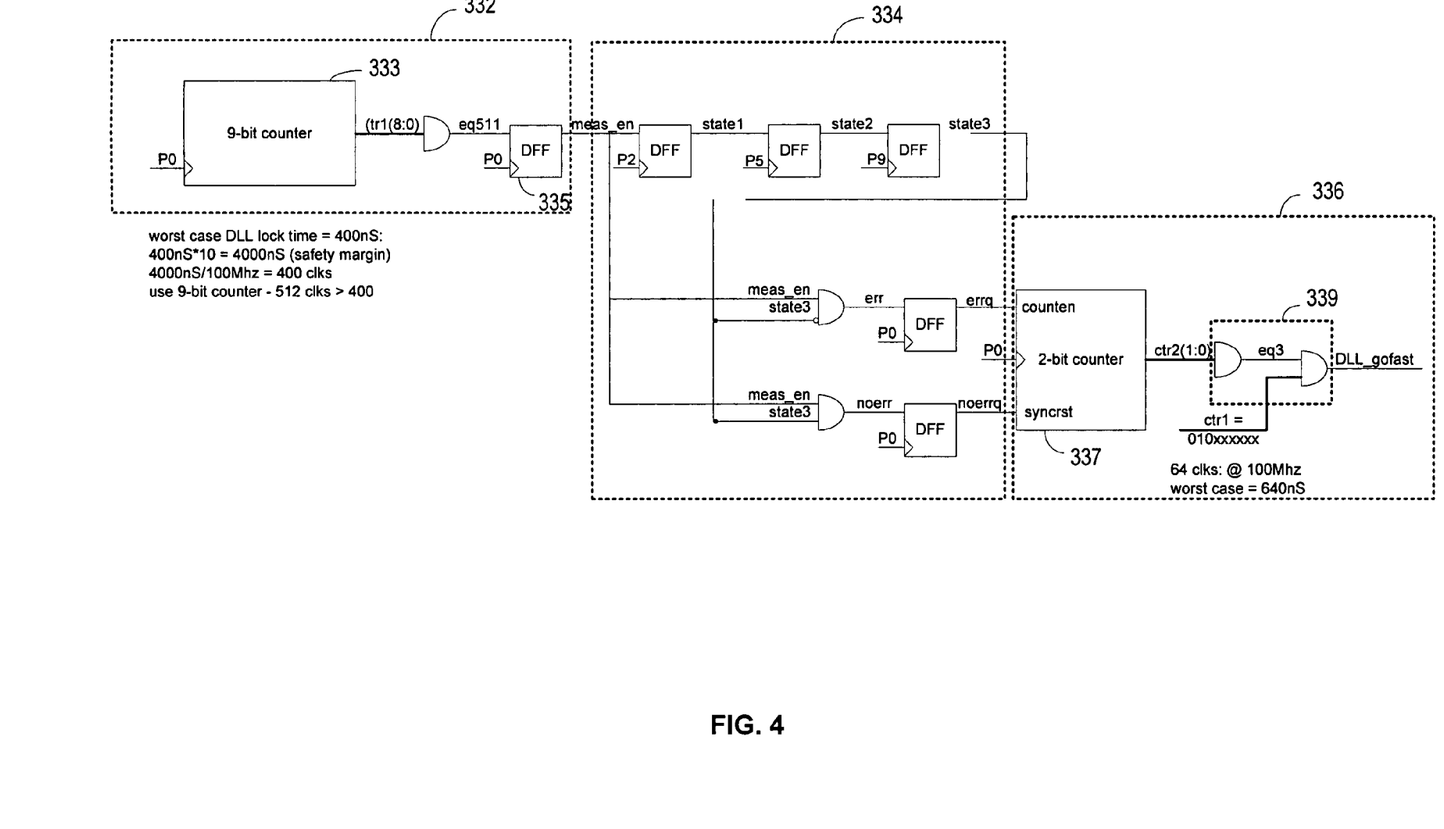
FIG. 4 is a block diagram of an embodiment of the detection circuit shown in FIG. 3.

FIG. 4 is a block diagram of an embodiment of the detection circuit 330 shown in FIG. 3. Referring to FIG. 4, the detection circuit 330 generates a detection signal DLL_gofast responsive to the input clock, i.e., phase P0. Note that phase P0 is coincident with the input clock CLK. The detection circuit 330 includes a first counter circuit 332. The first counter circuit 332 includes a first counter 333 to generate a first count ctr1(8:0) responsive to input clock P0. In an embodiment, the first counter circuit 332 counts a predetermined number of input clock periods, e.g., 512 clock periods. In an embodiment, the predetermined number of input clock periods is longer than the DLL lock time to prevent false triggers when a clock is initially connected. A flip flop 335 generates the measurement enable signal, labeled meas_en in FIG. 4, by logically manipulating the first count ctr1(8:0) with the input clock P0. In an embodiment, the flip flop 335 is a D flip flop. The flip flop 335 provides the measurement enable signal meas_en to a state machine 334.

The state machine 334 determines whether the DLL is locked properly to the input clock P0. If not, the state machine 334 generates the detection signal DLL_gofast that it provides to the control circuit 310 (FIG. 3). The control circuit 310, in turn, speeds up the DLL 300 to its minimum delay state and then releases the DLL so that it gradually slows down and locks to an input clock's fundamental.

In an embodiment, the state machine 334 asynchronously determines the presence of a predetermined number of states, e.g., state 1, state 2, and state 3. If these states are present in order and in a single input clock period, the detection circuit 330 determines the DLL is locked properly to a fundamental of the input clock and the state machine 334 generates a no error signal noerrq. The state machine 334 provides the no error signal noerrq to a second counter circuit 336.

If, however, the state machine 334 does not detect the presence of the predetermined number of states, e.g., state 1, state 2, and state 3, in order and in a single input clock period, the detection circuit 330 determines the DLL is locked improperly to a harmonic of the input clock. In this later case, the state machine 334 generates an error signal errq that it provides to the second counter circuit 336.

In an embodiment, the state machine 334 uses any number of predetermined states. And the predetermined states may be selected to simplify the state machine's timing. In an embodiment, the predetermined states are spaced at least two clock phases apart, e.g., P2, P5, and P9, to relax timing requirements and allow for slower timing paths than would be required if the states were spaced closer together.

The second counter circuit 336 includes a second counter 337 to generate a second count ctr2(1:0) responsive to the error and no error signals errq and noerrq, respectively, and responsive to the input clock P0. The second counter 337 provides the second count signal ctr2(1:0) to a logic circuit 339 that logically manipulates the second count signal ctr2 with the first count signal ctr1. The second counter circuit 337 generates the detection signal DLL_gofast when a number of consecutive error signals errq, e.g., 3, occur.

Figure 5:
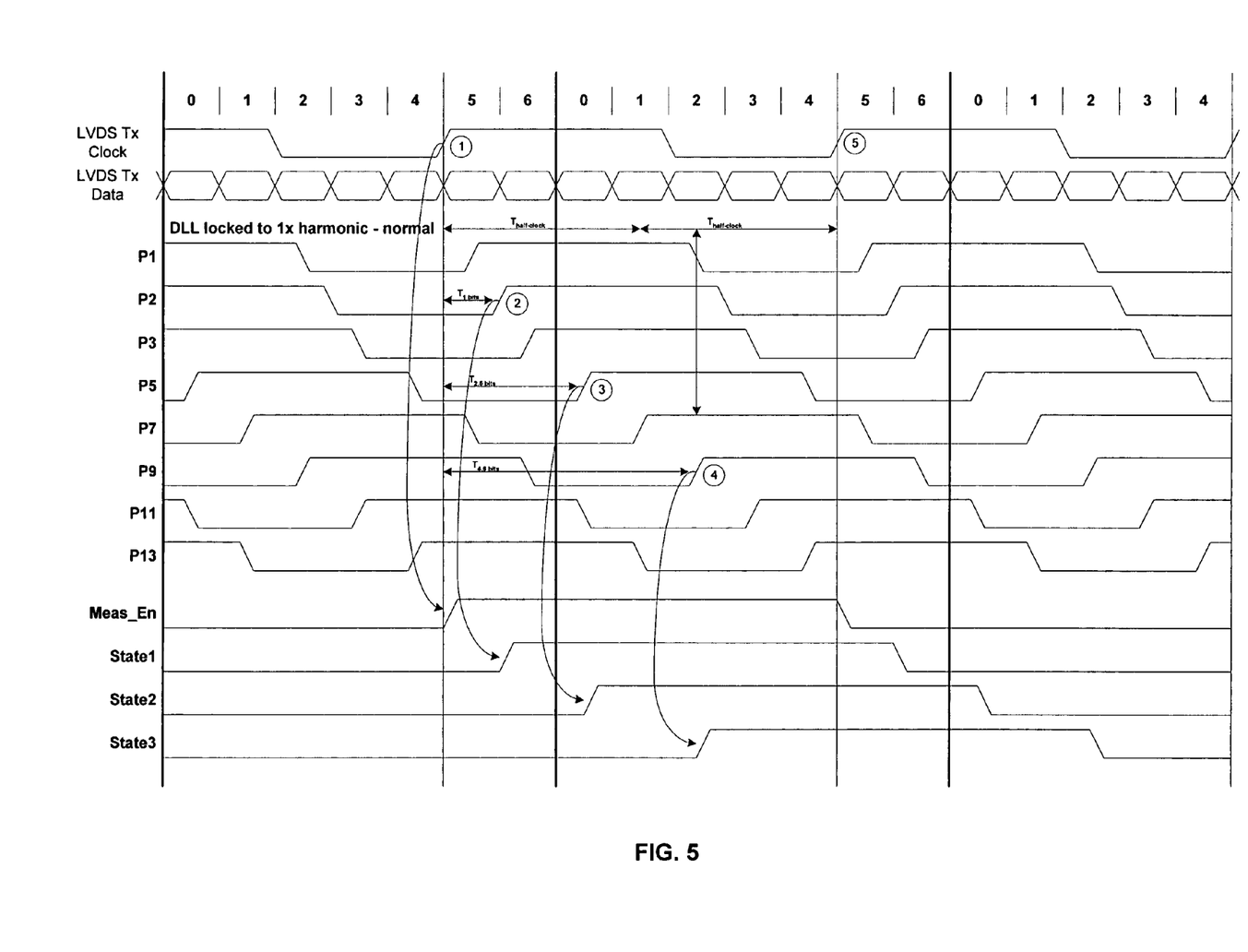
FIGS. 5 and 6A–E are timing diagrams illustrating exemplary operation of the DLL shown in FIGS. 2–4.

FIGS. 5 and 6A–E are timing diagrams illustrating exemplary operation of the DLL 300 shown in FIGS. 3–4. FIG. 5 illustrates the DLL 300's operation when it locks properly to a fundamental of the input clock. After the measurement enable signal meas_en goes high responsive to a low to high transition of the input clock at 1, state 1 goes high responsive to a low to high transition of input clock phase P2 at 2. State 2 goes high responsive to a low to high transition of input clock phase P5 at 3. And state 3 goes high responsive to a low to high transition of input clock phase P9 at 4. States 1, 2, and 3 are therefore present in sequence and within a single clock period ending at 5. The DLL 300 is properly locked to a principal of the input clock as indicated by state 3 being high at the next low to high transition of the input clock at 5$_{[ryg2]}$.

Figure 6A:
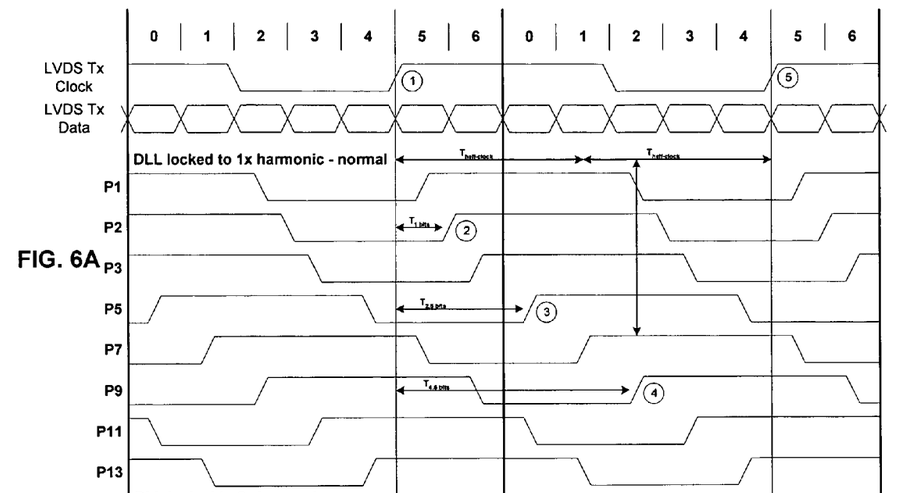

Referring to FIG. 6A, states 1, 2, and 3 go high at 2, 3, and 4, respectively, responsive to a low to high transition of the input clock at 1. Because all three states are present sequentially before the next low to high transition of the input clock at 5, the DLL 300 is properly locked to a harmonic of the input clock$_{[ryg3]}$.

Figure 6B:
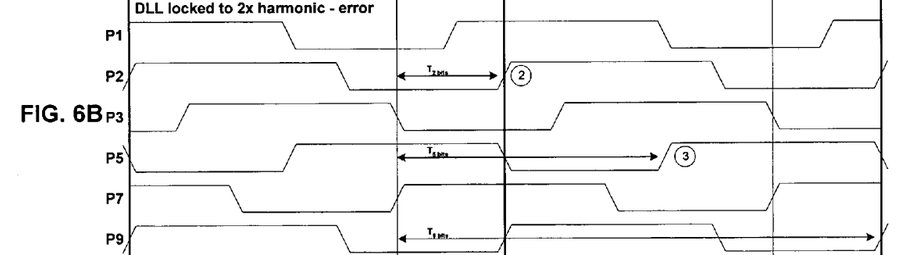

Referring to FIG. 6B, only states 1 and 2 go high at 2 and 3, respectively, responsive to a low to high transition of the input clock at 1. State 3 (low to high transition of phase P9) goes high after the low to high transition of the input clock at 5. This indicates that the DLL 300 is improperly locked to a second harmonic of the input clock. The detection circuit may generate the detection signal DLL_gofast in this example.

Figure 6C:
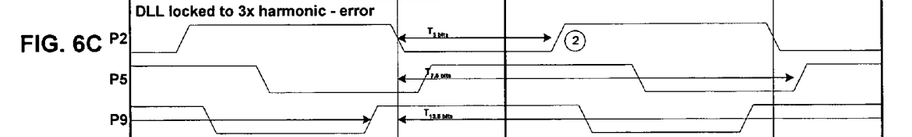

Referring to FIG. 6C, only state 1 goes high at 2 responsive to a low to high transition of the input clock at 1. State 2 (low to high transition of phase P5) goes high after the low to high transition of the input clock at 5. State 3 (low to high transition of phase P9) goes high before the low to high transition of the input clock at 5 but does not follow state 2. Since all three states are not present sequentially within a single input clock period, the DLL 300 is improperly locked to a third harmonic of the input clock. The detection circuit may generate the detection signal DLL_gofast in this example.

Figure 6D:
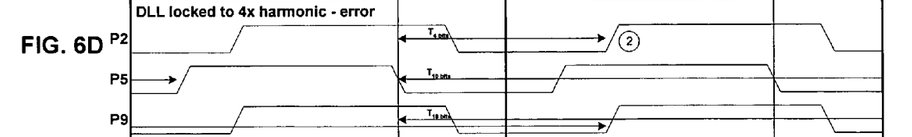

Referring to FIG. 6D, only state 1 goes high at 2 responsive to a low to high transition of the input clock at 1. States 2 and 3 (low to high transitions of phases P5 and P9) go high at after the low to high transition of the input clock at 5. But state 2 is present before state 1, thus, the DLL 300 is improperly locked to a fourth harmonic of the input clock. The detection circuit may generate the detection signal DLL_gofast in this example.

Figure 6E:
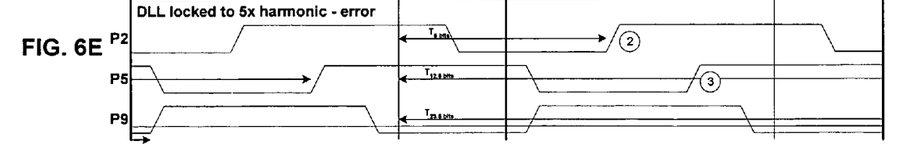

Referring to FIG. 6E, state 1 goes high at 2 responsive to a low to high transition of the input clock at 1. State 2 (low to high transition of phase P5) goes high after state 1. State 3 (low to high transition of phase P9), however, goes high before states 1 and 2 are present. The DLL 300 is improperly locked to a fifth harmonic of the input clock. The detection circuit may generate the detection signal DLL_gofast in this example.

I have illustrated and described the principles of this application by way of illustrative and not restrictive examples. Those of skill in the art will recognize certain modifications, permutations, additions, and sub-combinations to the exemplary embodiments I describe above. I intend that the following claims and those claims I introduce later be interpreted to include all such modifications, permutations, additions, sub-combinations as are within the spirit and scope.

I claim:

1. A delay locked loop comprising:
    a detection circuit to generate a detection signal responsive to an input clock; and
    a control circuit to synchronize the delay locked loop to a fundamental of the input clock responsive to the detection signal;
    where the detection circuit includes a state machine to generate an error signal responsive to the input clock; and
    where the state machine is adapted to generate the error signal every predetermined number of input clock periods.

2. The delay locked loop of claim 1 where the detection circuit is adapted to generate the detection signal responsive to the state machine.

3. The delay locked loop of claim 2 where the detection circuit is adapted to generate the detection signal responsive to the state machine detecting a number of consecutive error signals.

4. The delay locked loop of claim 1 where the control circuit is adapted to speed the delay locked loop to a minimum delay state responsive to the detection signal.

5. A delay locked loop comprising:
    a detection circuit to generate a detection signal responsive to an input clock; and a control circuit to synchronize the delay locked loop to a fundamental of the input clock responsive to the detection signal;
where the control circuit is adapted to speed the delay locked loop to a minimum delay state responsive to the detection signal; and
where the control circuit is adapted to release the delay locked loop after speeding it up.

6. A delay locked loop comprising:
a detection circuit to generate a detection signal responsive to an input clock; and
a control circuit to synchronize the delay locked loop to a fundamental of the input clock responsive to the detection signal;
where the detection circuit includes a state machine to generate an error signal responsive to the input clock; and
where the detection circuit includes:
a first counter to generate a first count responsive to a phase of the input clock; and
a second counter to generate a second count responsive to the state machine.

7. The delay locked loop of claim 6 where the control circuit is adapted to speed the delay locked loop to a minimum delay state responsive to the detection signal.

8. A delay locked loop comprising:
means for generating a detection signal responsive to an input clock; and
means for locking the delay locked loop to a fundamental of the input clock responsive to the detection signal;
where the means for generating the detection signal include means for generating an error signal responsive to detecting predetermined states of the input clock; and
where the means for generating the error signal operates every predetermined number of input clock periods.

9. The delay locked loop of claim 8 where the means for generating the detection signal includes means for detecting a predetermined number of consecutive error signals.

10. The delay locked loop of claim 8 where the means for locking is adapted to speed the delay locked loop to a minimum delay state responsive to the detection signal.

11. A delay locked loop of claim 10, comprising:
means for generating a detection signal responsive to an input clock; and
means for locking the delay locked loop to a fundamental of the input clock responsive to the detection signal;
where the means for locking is adapted to speed the delay locked loop to a minimum delay state responsive to the detection signal; and
where the means for locking is adapted to release the delay locked loop after speeding it up.

12. A delay locked loop comprising:
means for generating a detection signal responsive to an input clock; and
means for locking the delay locked loop to a fundamental of the input clock responsive to the detection signal;
where the means for generating the detection signal include means for generating an error signal responsive to detecting predetermined states of the input clock; and
where the means for generating the detection signal includes:
means for counting to a first count responsive to a phase of the input clock; and
means for counting to a second count responsive to error signal.

13. The delay locked loop of claim 12 where the means for locking is adapted to speed the delay locked loop to a minimum delay state responsive to the detection signal.

14. A method comprising:
detecting harmonic synchronization in a delay locked loop responsive to an input clock; and
locking the delay locked loop to a fundamental of the input clock responsive to the detecting;
where detecting includes enabling detecting every predetermined clock periods.

15. The method of claim 14 where detecting includes generating a detection signal responsive to detecting a predetermined number of error signals.

16. The method of claim 14 where locking includes speeding up the delay locked loop responsive to the detecting.

17. A method of comprising:
detecting harmonic synchronization in a delay locked loop responsive to an input clock; and
locking the delay locked loop to a fundamental of the input clock responsive to the detecting;
where detecting includes generating an error signal if predetermined states of the input clock are not present in a predetermined time.

18. The method of claim 17 where detecting includes generating a detection signal responsive to detecting a predetermined number of error signals.

19. The method of claim 17 where locking includes speeding up the delay locked loop responsive to the detecting.

20. A method comprising:
detecting harmonic synchronization in a delay locked loop responsive to an input clock; and
locking the delay locked loop to a fundamental of the input clock responsive to the detecting;
where locking includes speeding up the delay locked loop responsive to the detecting; and
where locking includes releasing the delay locked loop after speeding up responsive to detecting.

* * * * *